(12) United States Patent
Mueller et al.

(10) Patent No.: US 6,426,658 B1
(45) Date of Patent: Jul. 30, 2002

(54) BUFFERS WITH REDUCED VOLTAGE INPUT/OUTPUT SIGNALS

(75) Inventors: Gerhard Mueller, Meitingen (DE); David Russell Hanson, Brewster, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/676,864

(22) Filed: Sep. 29, 2000

(51) Int. Cl.$^7$ .......................................... H03K 19/0185
(52) U.S. Cl. .................. 327/112; 327/208; 327/214; 327/333; 326/81; 326/83
(58) Field of Search .................. 327/112, 333, 327/208, 210, 214; 326/80, 81, 83, 112, 119, 121, 122

(56) References Cited

U.S. PATENT DOCUMENTS

| | | | | | |
|---|---|---|---|---|---|
| 5,367,205 A | * | 11/1994 | Powell | .......................... | 326/27 |
| 5,461,585 A | * | 10/1995 | Chonan | ....................... | 327/264 |
| 5,559,452 A | * | 9/1996 | Saito | ........................... | 326/88 |
| 6,163,171 A | * | 12/2000 | Jinbo | .......................... | 326/112 |
| 6,271,713 B1 | * | 8/2001 | Krishnamurthy | ............ | 327/112 |

* cited by examiner

Primary Examiner—Timothy P. Callahan
Assistant Examiner—Terry L. Englund
(74) Attorney, Agent, or Firm—Stanton Braden

(57) ABSTRACT

A buffer circuit that operates with reduced voltage input and output signals receives an input signal having reduced voltage range and generates an output signal with the reduced voltage range. The reduced voltage range is from 0 volts to $V_{RED}$, where $V_{RED}$ is less than $V_{CC}$, the voltage used to operate most of the logic in the integrated circuit. The use of a buffer circuit that receives and generates signals with a reduced voltage range advantageously reduces power consumption.

18 Claims, 15 Drawing Sheets

BUFFERS WITH REDUCED VOLTAGE INPUT/OUTPUT SIGNALS

FIELD OF THE INVENTION

The present invention relates to buffer circuits. More particularly, the present invention relates to buffer circuits that are capable of receiving and producing reduced voltage signals.

BACKGROUND OF THE INVENTION

Buffer circuits are typically employed in integrated circuits (ICs). In conventional buffer circuits, the upper power rail is at $V_{DD}$ and the lower power rail at ground. $V_{DD}$ is the voltage level at which the majority of the logic in the IC operate. The input and output signals of the buffer circuit swing between 0V (for a logic 0) and $V_{DD}$ (for a logic 1).

The power consumption of the IC is related to the value of $V_{DD}$. Power consumption, in some instances, is a concern for IC designers. For example, it is desirable to design ICs which consume less power for portable applications, thereby enabling longer operation without recharging. Thus, it is desirable to provide a buffer circuit which decreases power consumption.

SUMMARY OF THE INVENTION

The invention relates to a buffer circuit that receives and generates signals having a reduced voltage range from $V_{SS}$ to $V_{RED}$. In accordance with the invention, $V_{RED}$ comprises a voltage level less than $V_{DD}$, where $V_{DD}$ is the voltage used to operate a majority of the logic in the integrated circuit, $V_{DD}$ is about 3.3 volts or less. In one embodiment, the buffer circuit comprises input and output stages. The output stage comprises pull-up and pull-down transistors coupled in series between $V_{RED}$ and $V_{SS}$. The output node is coupled between common terminals of the pull-up and pull-down transistors. The pull-up and pull-down transistors operate in a push-pull configuration. When the pull-up transistor is switched on and the pull-down transistor is switched off, the output stage generates a logic 1 output signal equal to about $V_{RED}$. On the other hand, when the pull-up transistor is switched off and the pull-down transistor is switched on, the output stage generates a logic 0 output signal equal to about $V_{SS}$.

DESCRIPTION OF PREFERRED EMBODIMENTS OF THE INVENTION

Figure 1:
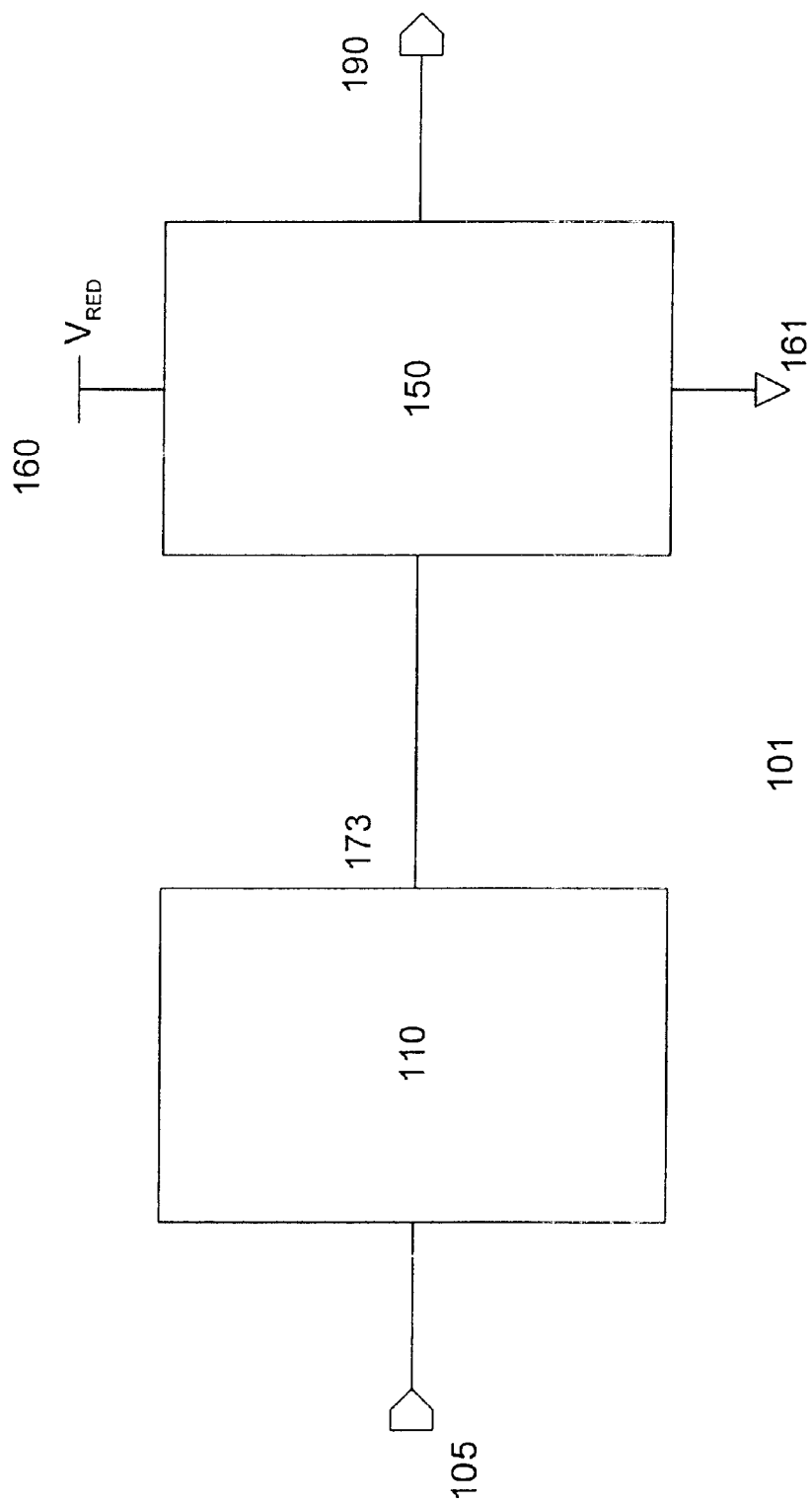
FIG. 1 shows an embodiment of a buffer circuit in accordance with the invention.

The invention relates to buffer circuits that reduce power consumption. In accordance with the invention, reduced power consumption is achieved by providing a buffer circuit that can operate with input and output signals having a reduced voltage swing from about $V_{SS}$ to $V_{RED}$, where $V_{RED}$ is less than $V_{DD}$. $V_{DD}$ is the voltage used to operate the majority of the logic in the IC. FIG. 1 shows a buffer circuit in accordance with one embodiment of the invention. The buffer circuit 101 includes an input stage 110 and an output stage 150. The input stage receives an input signal at an input node 105 and generates one or more control signals at control output nodes 173. The input signal comprises a reduced voltage range. In one embodiment, the reduced voltage range is from about $V_{SS}$ or 0 volts (logic 0) to about $V_{RED}$ (logic 1). The output stage comprises upper and lower rails 160 and 161. In accordance with the invention, the upper rail is coupled to $V_{RED}$ and the lower rail is coupled to $V_{SS}$ or ground. The output stage receives the control signals and generates an output signal at the output node 190. The output signal also comprises the reduced voltage range (logic 0=$V_{SS}$ and logic 1=$V_{RED}$).

In one embodiment, the buffer circuit receives an input signal having one logic level and generates an output having the same logic level. In another embodiment, the buffer comprises an inverting buffer circuit which receives an input signal having one logic level and generates an output signal having the other or opposite logic level.

Figure 2:
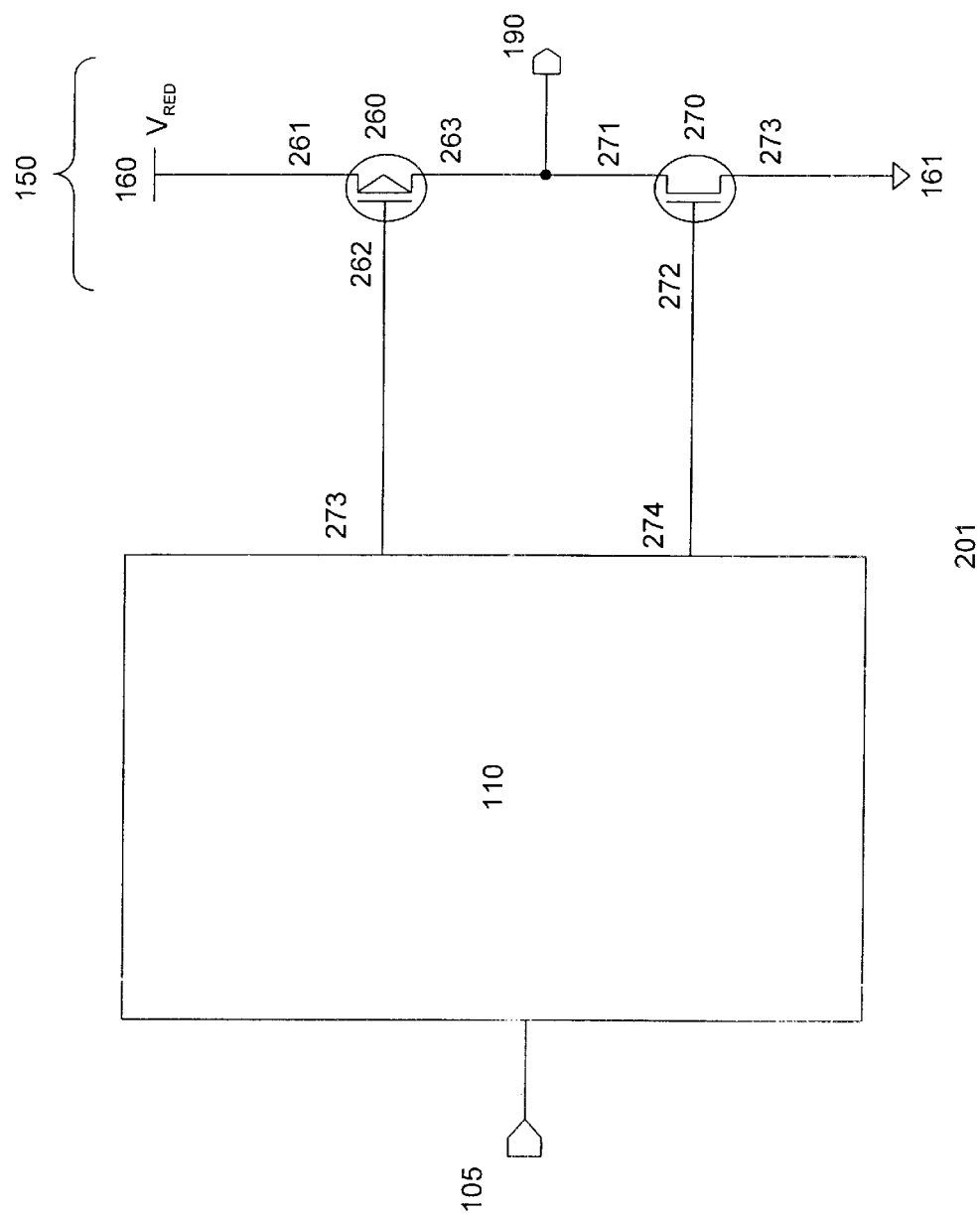
FIGS. 2–15 show buffer circuits in accordance with various embodiments of the invention.

Referring to FIG. 2, a buffer circuit in accordance with one embodiment of the invention is shown. As shown, the output stage 150 comprises first and second field effect transistors (FETs) 260 and 270 coupled in series between the upper and lower power rails 160 and 161. In a preferred embodiment, the transistors comprise low threshold FETs, as indicated by the circle surrounding the transistor. Typically, low threshold voltage transistors comprise a threshold voltage ($V_T$) which is lower than normal threshold transistors (e.g., about 0.4V–0.5V as compared to 0.6V–0.7V). In one embodiment, a first terminal 261 of the first transistor is coupled to the upper rail and a second terminal 273 of the second transistor is coupled to the lower rail. A second terminal 263 of the first transistor and a first terminal 271 of the second transistor are coupled to the output node 190.

In accordance with the invention, the upper power rail is coupled to $V_{RED}$ and the lower power rail is coupled to $V_{SS}$. In one embodiment, $V_{RED}$ is less than $V_{DD}$ and greater than $V_T$ of transistor 260. In one embodiment, the upper range of $V_{RED}$ is about 1.5V, preferably about 1.0V. The lower range of $V_{RED}$ is greater than 0.7V ($V_T$ for normal type FETs) and preferably greater than 0.4V ($V_T$ for low threshold FETs). Thus, employing low threshold FETs enables the use of a smaller $V_{RED}$.

The first and second transistors are controlled by the control signals at control output nodes 273 and 274 of the input stage 110. In one embodiment, first and second control output nodes are respectfully coupled to gate 262 of the first transistor and to gate 272 of the second transistor. The input stage generates the control signals to operate the transistors in a push-pull configuration (i.e., one is conductive while the other is non-conductive). The output stage generates a logic 1 (about $V_{RED}$) when the first transistor is conductive and the second transistor is non-conductive. Rendering the first transistor non-conductive and the second transistor conductive produces a logic 0 (about $V_{SS}$) output signal at the output node. Typically, the first transistor is referred to as the "pull-up transistor" and the second transistor is referred to as the "pull-down transistor."

In one embodiment, the first and second transistors are of the opposite type. As shown, the first transistor comprises a p-FET and the second transistor comprises an n-FET. Providing an output stage wherein the first transistor is an n-FET and the second transistor is a p-FET is also useful. Implementing the output stage with opposite type FETs enables the use of the same control signal to control both the pull-up and pull-down transistors.

Figure 3:
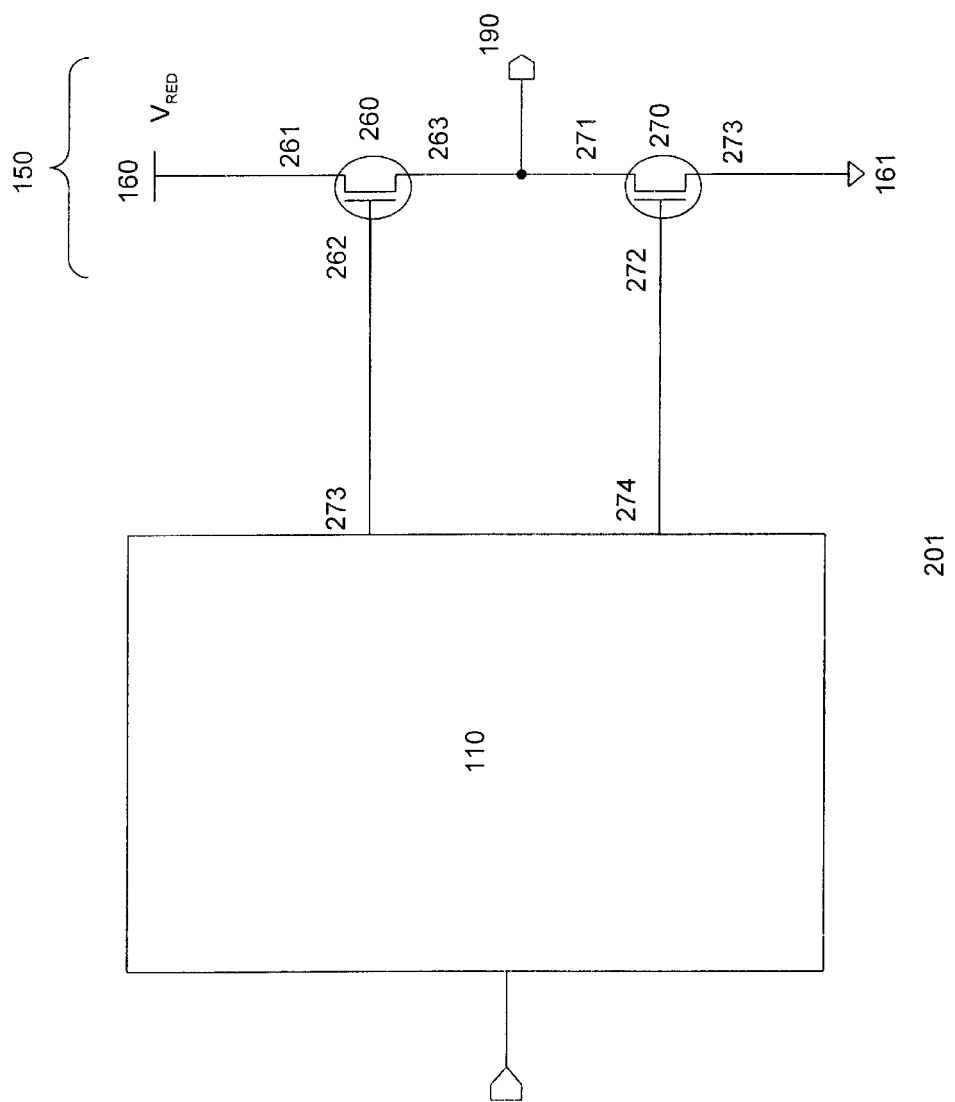

Alternatively, as shown in FIG. 3, the output stage 150 of the buffer circuit 201 comprises first and second transistors 260 and 270 that are of the same type. In one embodiment, the first and second transistors are n-FETs. Providing an output stage having p-FETs is also useful. Gates 262 and 272 of the first and second transistors receive control signals from the first and second control output nodes 273 and 274 of the input stage 110. The control signals comprise opposite logic levels (i.e., complement or inverted signals).

Figure 4:
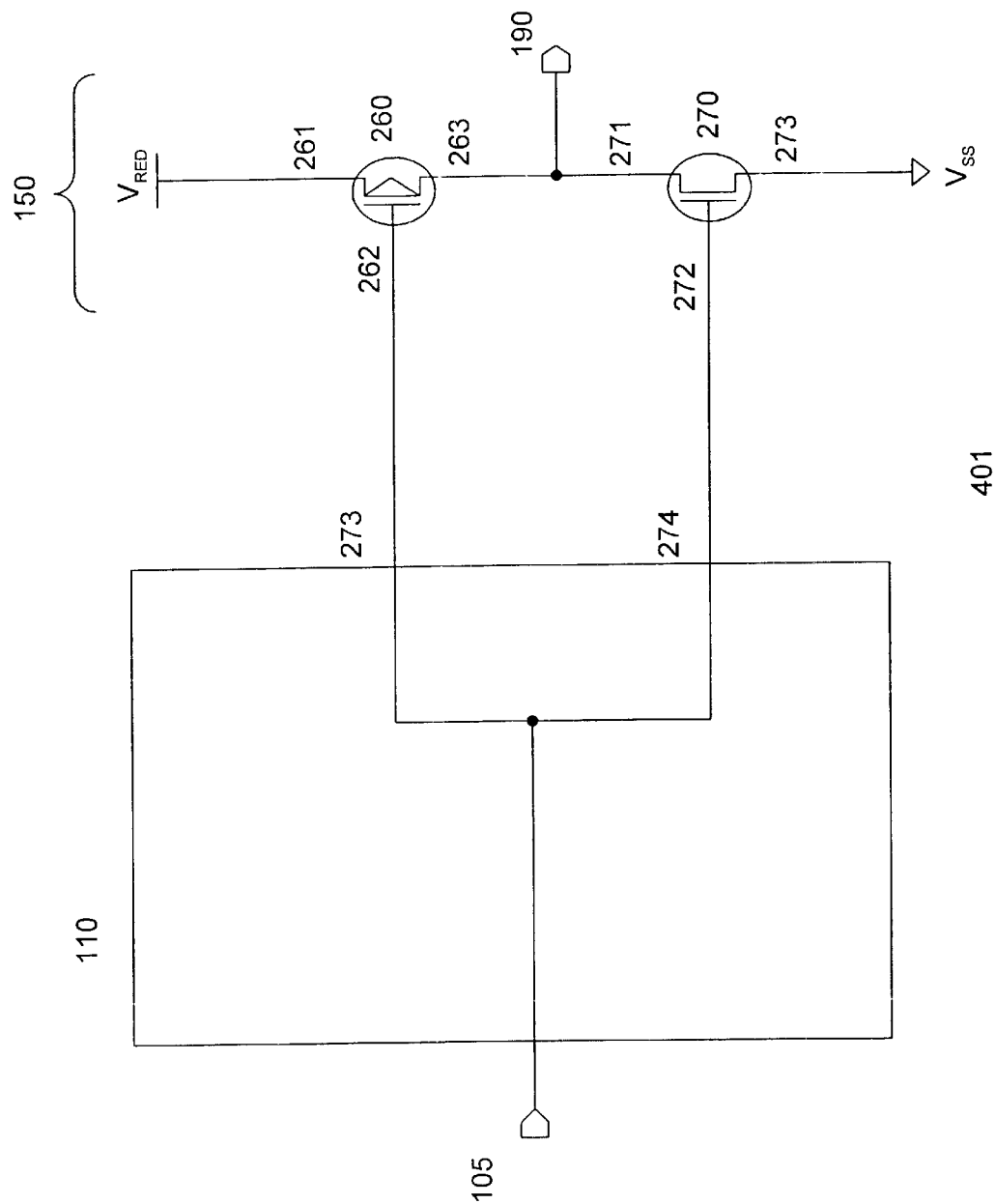

Referring to FIG. 4, an inverting buffer circuit 401 in accordance with one embodiment is shown. The output stage 150 comprises first and second transistors 260 and 270. As shown, the transistors are of the opposite type (e.g., n-FET/p-FET). The transistors are coupled in series between $V_{RED}$ and $V_{SS}$. In one embodiment, the first transistor is a p-FET and the second transistor is an n-FET. The input stage 110 receives the input signal at input node 105 having the reduced voltage range and couples it to first and second control output nodes 273 and 274. The control output nodes are coupled to gates 262 and 272 of the first and second transistors.

In operation, a logic 1 input signal (about $V_{RED}$) causes the first transistor to be non-conductive and the second transistor conductive, resulting in output node 190 being pulled down to ground. A logic 0 input signal (ground) renders the first transistor conductive and the second non-conductive, causing the output node to be pulled up to $V_{RED}$. As such, the inverting buffer circuit operates with input and output signals having a reduced voltage range from about 0V to $V_{RED}$.

Figure 5:
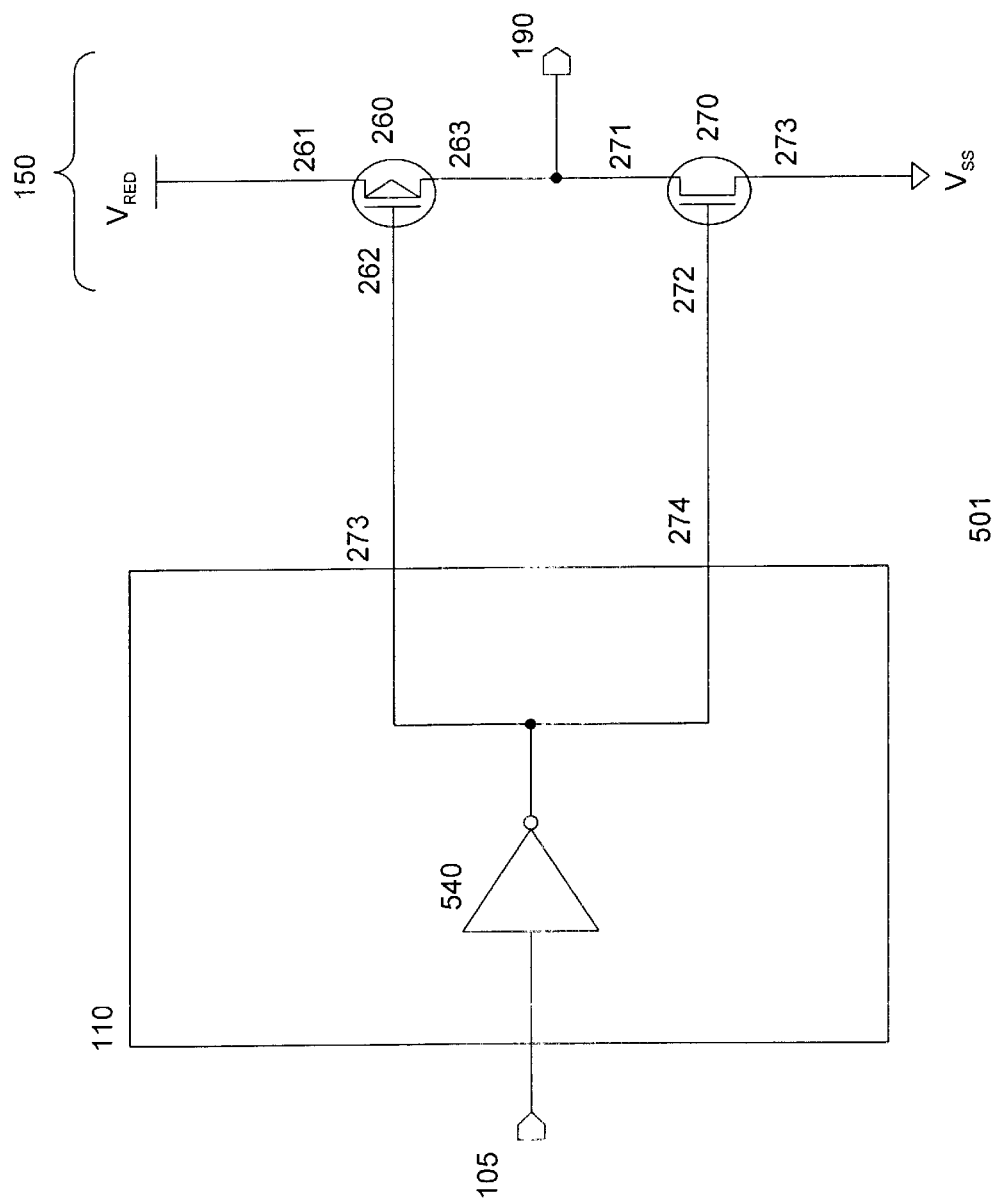
Figure 6:
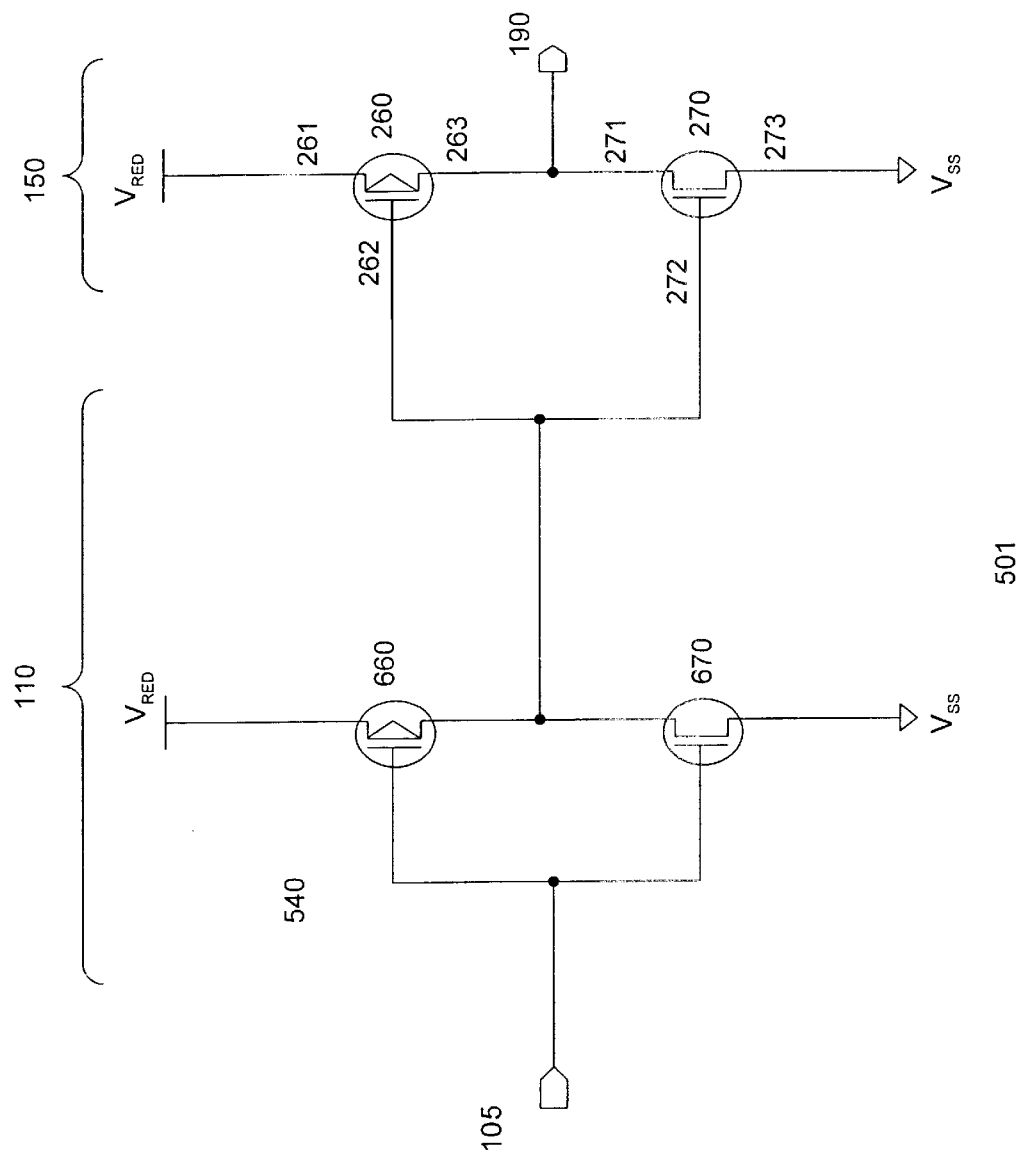

FIG. 5 shows a non-inverting buffer 501 in accordance with one embodiment of the invention. Similar to FIG. 4, the output stage comprises a p-FET 260 and an n-FET 270 coupled in series between $V_{RED}$ and $V_{SS}$. The input stage 110 comprises an inverter 540 to invert the reduced voltage input signal. The output of the inverter is coupled to the first and second control output nodes 273 and 274, inverting the input signal to serve as control signals for the output stage 150. The first and second control output nodes are coupled to gates 262 and 272 of the pull-up and pull-down transistors of the output stage. In a preferred embodiment, as shown in FIG. 6, the inverter 540 comprises first and second transistors 660 and 670 coupled in series between an upper power rail equal to $V_{RED}$ and a lower power rail equal to $V_{SS}$. In one embodiment, the first transistor is a p-FET and the second is an n-FET. As such, the non-inverting buffer comprises essentially two output stages cascaded together.

Figure 7:
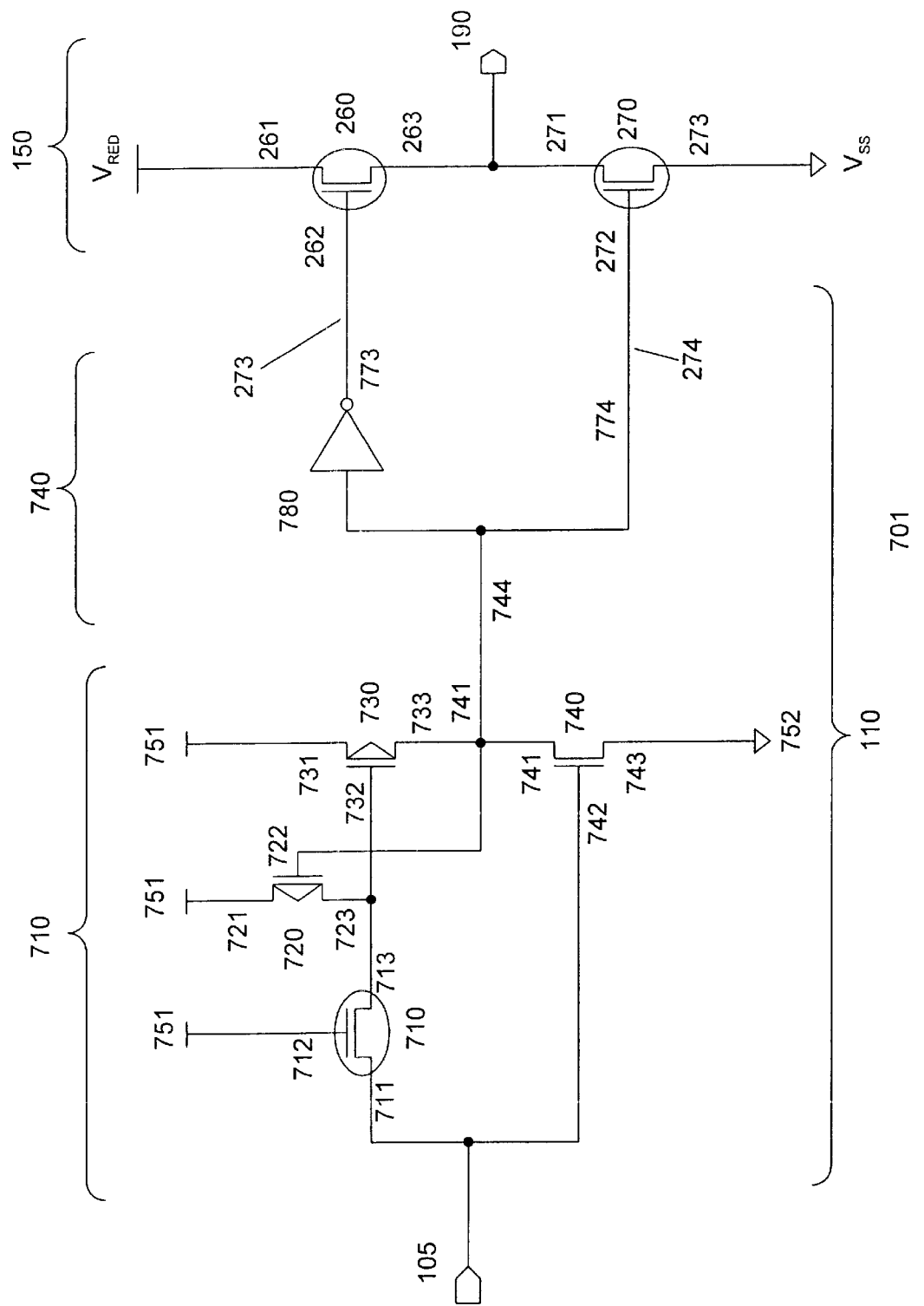

FIG. 7 shows another embodiment of a buffer circuit 701 having an input stage 110 and an output stage 150. The output stage comprises first and second transistors 260 and 270 which are of the same type. In one embodiment, the first and second transistors comprise n-FETs. Preferably, the transistors are low threshold transistors. The transistors are coupled in series between an upper rail equal to $V_{RED}$ and a lower rail equal to $V_{SS}$. The gates of the transistors are controlled by control signals from the input stage 110.

In one embodiment, the input stage 110 comprises first and second substages 710 and 740. The first substage receives an input signal having a reduced voltage range at input node 105 and generates a first substage output signal at a first substage output node 741. In one embodiment, the first substage output signal comprises a voltage range greater than the reduced voltage range. The first substage output signal has, for example, a voltage range in which a logic 0 is equal to 0 volts and a logic 1 is equal to about $V_{DD}$.

The second substage receives the first substage output signal at a second substage input node 744 and generates control signals at first and second control output nodes 273 and 274 to operate the output stage. The first and second signal paths 773 and 774 couple the control output nodes to the second substage input node. In one embodiment, the second substage generates control signals to operate the output stage in the inverting mode. Alternatively, the second substage generates control signals to operate the output stage in a non-inverting mode.

In one embodiment, the first substage comprises first and second transistors 730 and 740 in series between upper and lower power rails 751 and 752. The upper power rail, in accordance with one embodiment of the invention, is coupled to $V_{DD}$ and the lower power rail is coupled to $V_{SS}$. Coupling the upper power rail to a boosted voltage which is greater than $V_{DD}$ is also useful. In one embodiment, the first transistor is a p-FET and the second transistor is an n-FET. The first terminal 731 of the first transistor is coupled to the upper power rail, the second terminal 743 of the second transistor is coupled to the lower power rail, and the common terminals 733 and 741 are coupled to the first substage output node 741. Gates 732 and 742 of the transistors are coupled to the input node 105.

The first substage further comprises a third transistor 720. In one embodiment, the third transistor is a p-FET. A first terminal 721 is coupled to the upper power rail 751, a second terminal 723 is coupled to the input node, and the gate 732 of the first transistor. A gate 722 of the third transistor is coupled to the first substage output node. In one embodiment, a fourth transistor 710 is provided. The fourth transistor, in one embodiment, comprises an n-FET. Preferably, the fourth transistor is a low threshold voltage FET. A first terminal 711 is coupled to the input node while a second terminal 713 is coupled to the second terminal of the third transistor and the gate of the first transistor. A gate 712 is coupled to the upper power rail 751. The fourth transistor serves to decouple the gate 732 of transistor 730 from the input node when transistor 730 is non-conductive.

In operation, a reduced voltage input signal is provided at the input node. If the input signal is at the logic 1 level (i.e., $V_{RED}$), then the second transistor is switched on (conductive) and the first transistor is switched off (non-conductive). This results in the output node being pulled to $V_{SS}$ (0V). A logic 0 output signal causes the third transistor 720 to be switched on. This maintains the voltage at the gate of the first transistor at $V_{DD}$, keeping the first transistor switched off. If the input signal is a logic 0 (i.e., 0V), then the first transistor is switched on and the second transistor is switched off, pulling the output node to the voltage level of the upper power rail, ($V_{DD}$ or greater). As such, the first substage generates a first substage output signal wherein the logic 1 level is greater than $V_{RED}$.

The second substage 740 generates first and second control signals from the first substage output signal at first and second control output nodes 273 and 274 to operate the output stage 150. The control signals are, for example, equal to and/or the complement of the first substage output signal. In one embodiment, the second substage generates control signals to form a non-inverting buffer circuit. Generating control signals to form an inverting buffer circuit is also useful.

The output stage 150 comprises first and second transistors coupled in series between an upper power rail 160 and a lower power rail 161. In accordance with the invention, the upper power rail is coupled to $V_{RED}$ and the lower power rail is coupled to ground. The first and second transistors can be of the same type, for example, n-FETs, as described in FIG. 3. The use of p-FETs is also useful.

In one embodiment, the second substage receives the first substage output signal and couples it to the first and second control signal paths 773 and 774. To provide complement control signals to operate the output stage, an inverter 780 is provided in one of the control signal paths to invert the first substage output signal.

Figure 8:
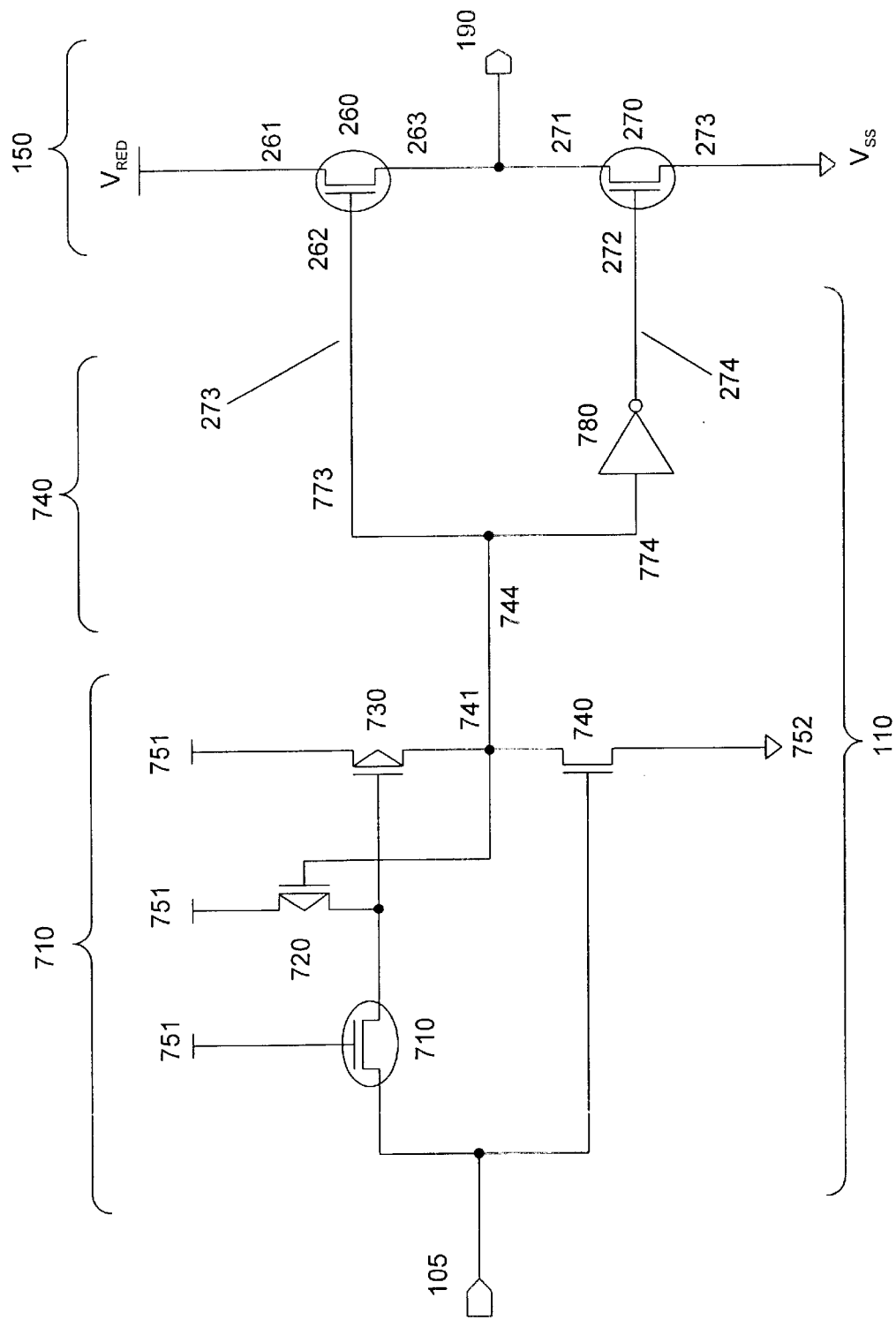

In one embodiment, the second substage generates control signals to form a non-inverting buffer circuit. The inverter 780 can be provided along the first control signal path while the second control signal path is coupled to the second substage input node 744. As such, the inverted first substage output signal serves as the first control signal for the pull-up transistor 260 and the non-inverted first substage output signal serves as the second control signal for the pull-down transistor 270. An inverting buffer is formed by providing the inverter 780 in the second control signal path 774 instead of the first control signal path 773, as shown in FIG. 8.

Figure 9:
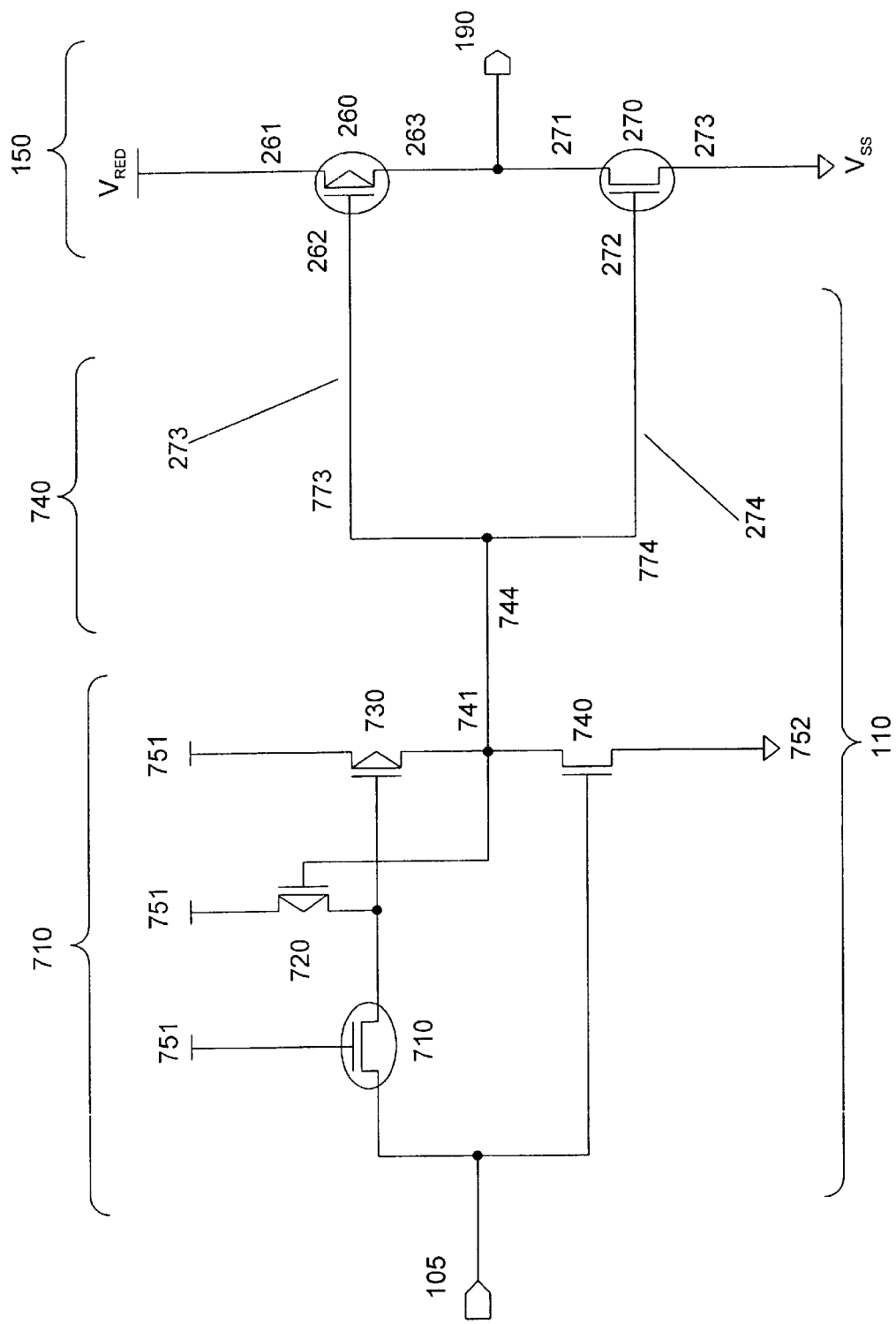
Figure 10:
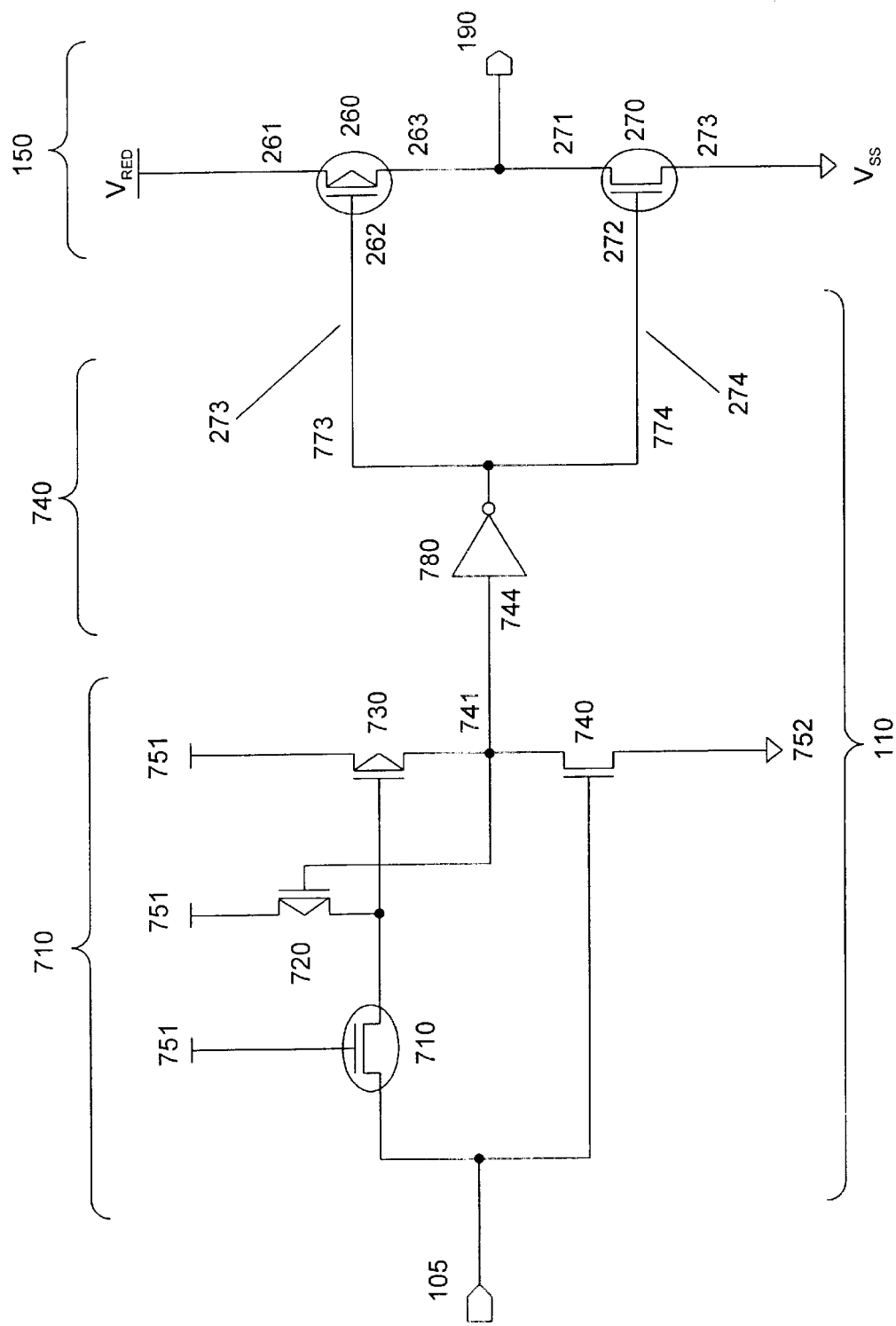

In an alternative embodiment, as shown in FIG. 9, the output stage 150 comprises a p-FET pull-up transistor 260 and an n-FET pull-down transistor 270 (as described in FIG. 2). Having an n-FET pull-up transistor and a p-FET pull-down transistor is also useful. To form a non-inverting buffer circuit, the second substage comprises first and second output nodes 273 and 274 which are coupled to the second substage input node 744 via control signal paths 773 and 774. As a result, the first substage output signal serves as the first and second control signals for the pull-up and pull-down transistors 260 and 270. An inverting buffer circuit is formed by providing an inverter 780 having its input terminal coupled to the second substage input node 744 and its output terminal coupled to the first and second control signal paths 773 and 774, as shown in FIG. 10. In a preferred embodiment, the inverter 780 comprises first and second transistors coupled in series between $V_{RED}$ and $V_{SS}$. The first transistor is, for example, a p-FET and the second transistor is an n-FET. Preferably, the transistors of the inverter 780 are reduced threshold voltage transistors.

Figure 11:
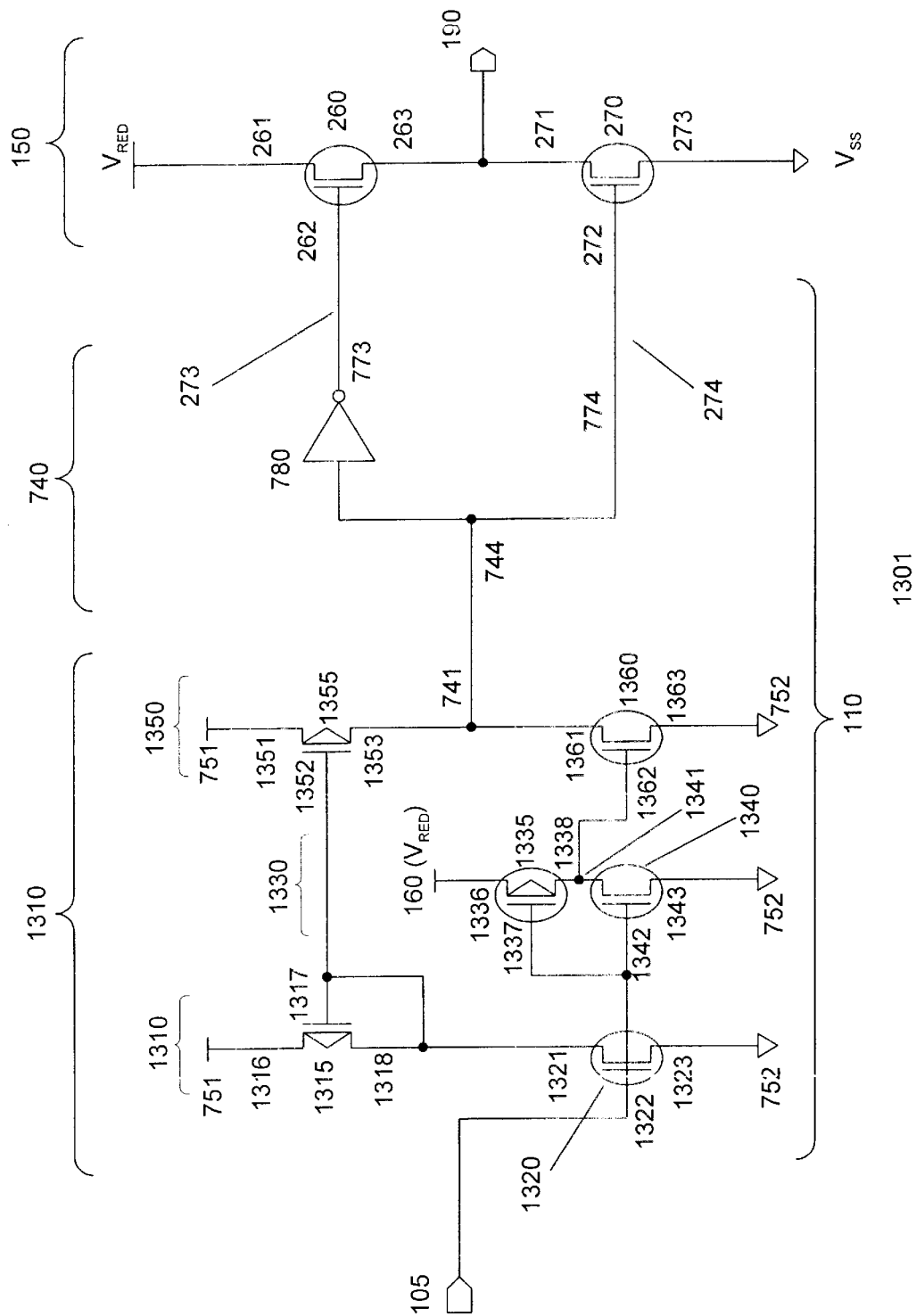

FIG. 11 shows yet another embodiment of a buffer circuit 1301. The buffer circuit includes an input stage 110 and an output stage 150. The input stage comprises first and second substages 1310 and 740. The first substage receives the reduced voltage input signal at an input node 105 and generates a first substage output signal at a first substage outage node 741. The voltage range of the output signal is greater than $V_{RED}$. In one embodiment, the voltage range of the first substage output signal is equal to $V_{DD}$. In another embodiment, the voltage range of the output signal is greater than $V_{DD}$ to increase the drivability of the output stage.

In accordance with one embodiment of the invention, the first substage comprises first, second, and third transistor pairs 1310, 1330, and 1350. The first and second transistors 1315 and 1320 of the first pair are coupled in series between upper and lower power rails 751 and 752, as are the fifth and sixth transistors 1355 and 1360 of the third pair. The upper rail, in one embodiment, is coupled to $V_{DD}$ and the lower rail is coupled to $V_{SS}$. Providing an upper rail coupled to a voltage source greater than $V_{DD}$ is also useful. The third and fourth transistors 1335 and 1340 of the second transistor pair are coupled in series between a reduced upper power rail 160 ($V_{RED}$) and the lower power rail 752. In one embodiment, the first, third, and fifth transistors are p-FETs and the second, fourth and sixth transistors are n-FETs. Preferably, the second, third, fourth, and sixth transistors are low threshold transistors.

Gates 1322, 1337, and 1342 of the second, third, and fourth transistors are coupled to the input node 105. Gates 1317 and 1352 of the first and fifth transistors are commonly coupled to the common terminals 1318 and 1321 of the first and second transistors. The common terminals 1338 and 1341 of the third and fourth transistors are coupled to a gate 1362 of the sixth transistor; the common terminals 1353 and 1361 of the fifth and sixth transistors are coupled to the first substage output node 741.

In operation, a reduced voltage input signal is provided at the input node. A logic 1 (i.e., $V_{RED}$) input signal causes the first substage output node to be pulled up to the voltage level of the upper power rail, which is equal to $V_{DD}$ or greater. A logic 0 input signal causes the first substage output node to be pulled down to ground.

The second substage 740 generates first and second control signals from the first substage output signal to operate the output stage 150. As shown, the output stage comprises n-FET pull-up and pull-down transistors 260 and 270 in series between reduced voltage upper rail 160 and lower rail 161. The use of p-FET pull-up and pull-down transistors is also useful. The control signals are, in one embodiment, generated to form an inverting buffer.

Figure 12:
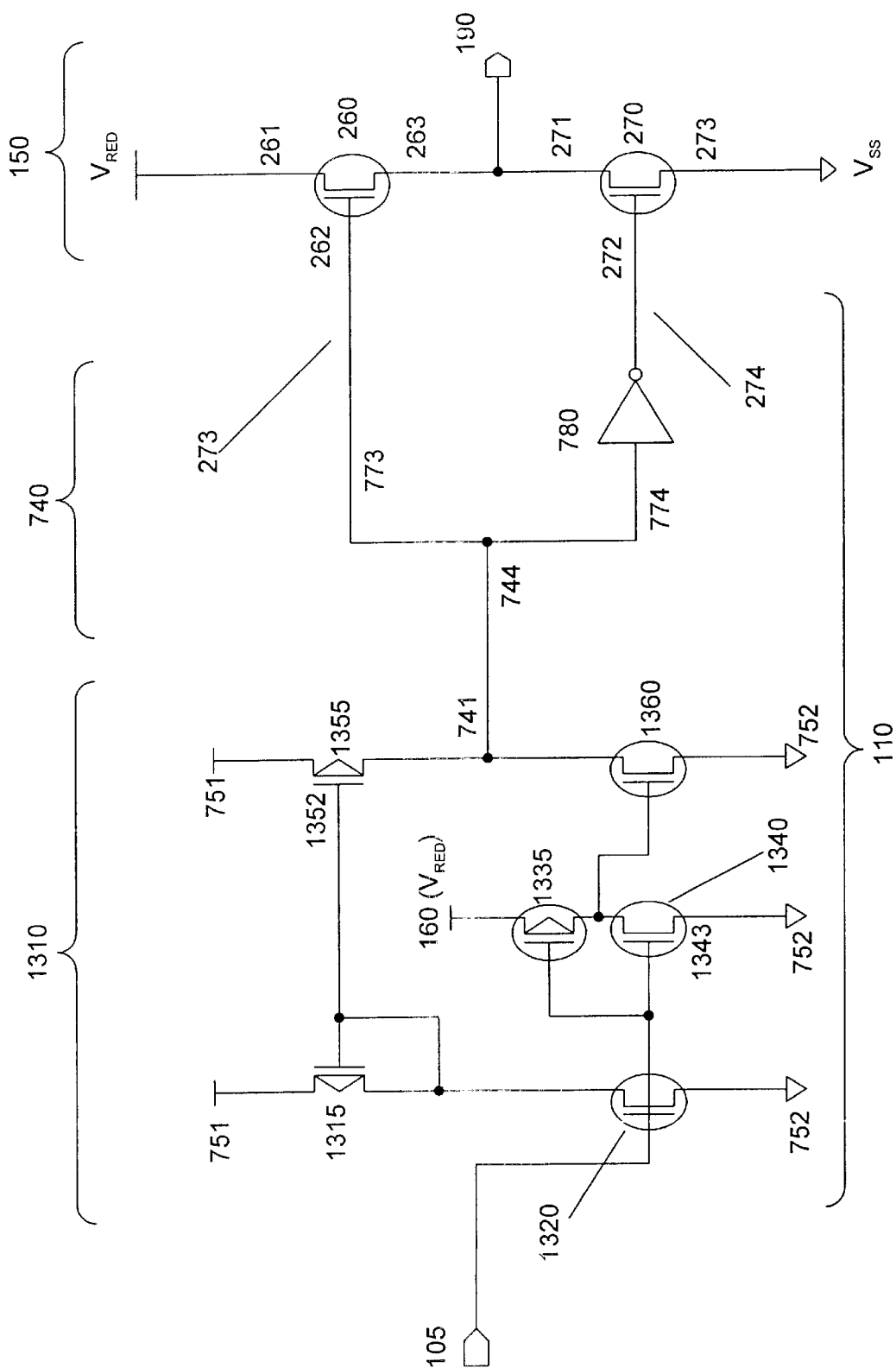

In one embodiment, the second substage comprises a second substage input node 744 coupled to first and second control signal paths 773 and 774. The control signal paths are coupled to control output nodes 273 and 274, which are coupled to gates 262 and 272 of the pull-up and pull-down transistors of the output stage. The input node 744 is coupled to the first substage output node 741, receiving the first substage output signal. An inverter 780 is provided in the first control signal path to invert the first substage output signal; the second signal path is coupled to the input node 744. As such, the second substage generates complementary control signals to form an inverting buffer. A non-inverting buffer, as shown in FIG. 12, is formed by configuring the second substage to include the inverter 780 in the second signal path 774 instead of the first control signal path 773.

Figure 13:
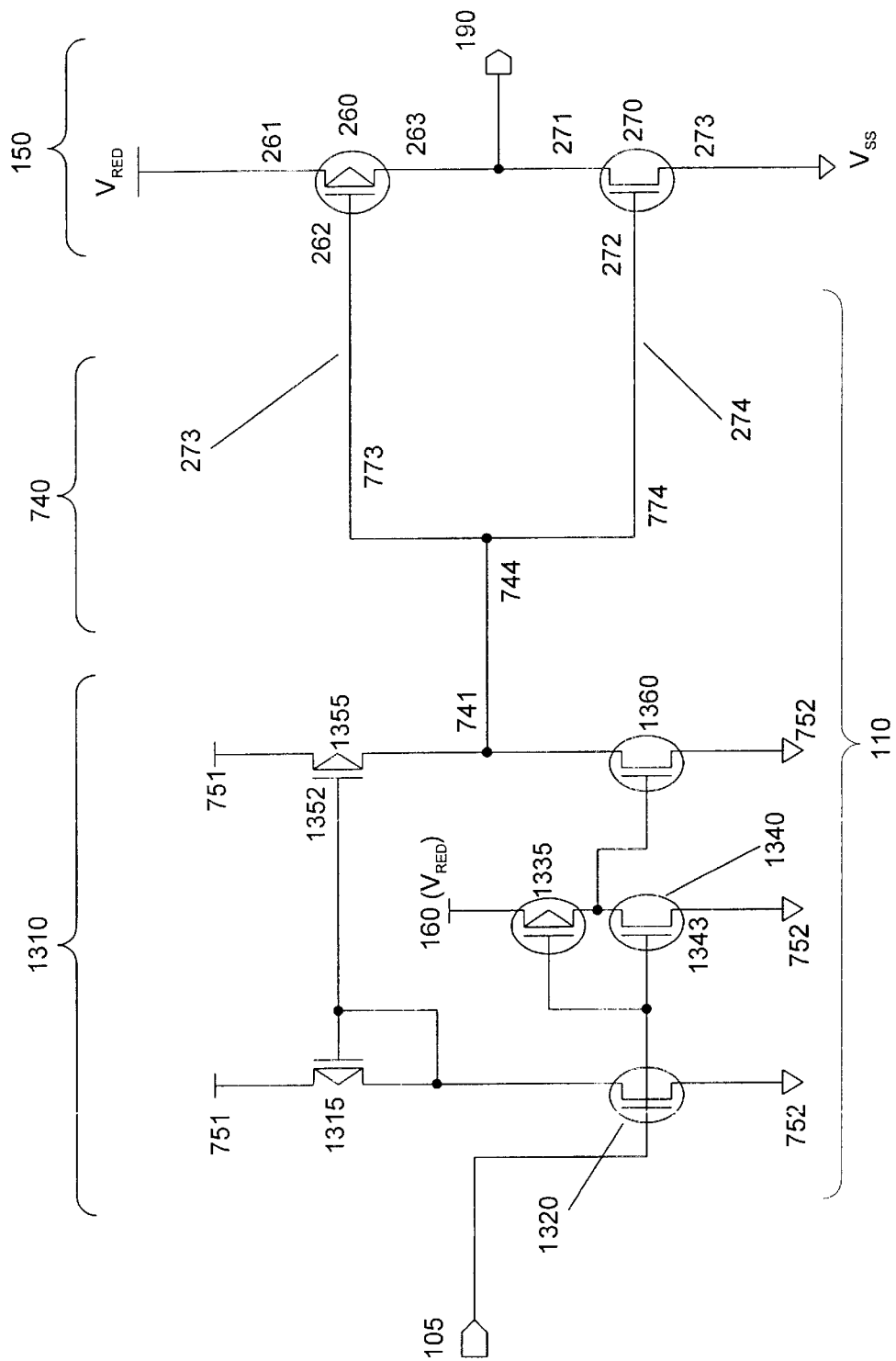
Figure 14:
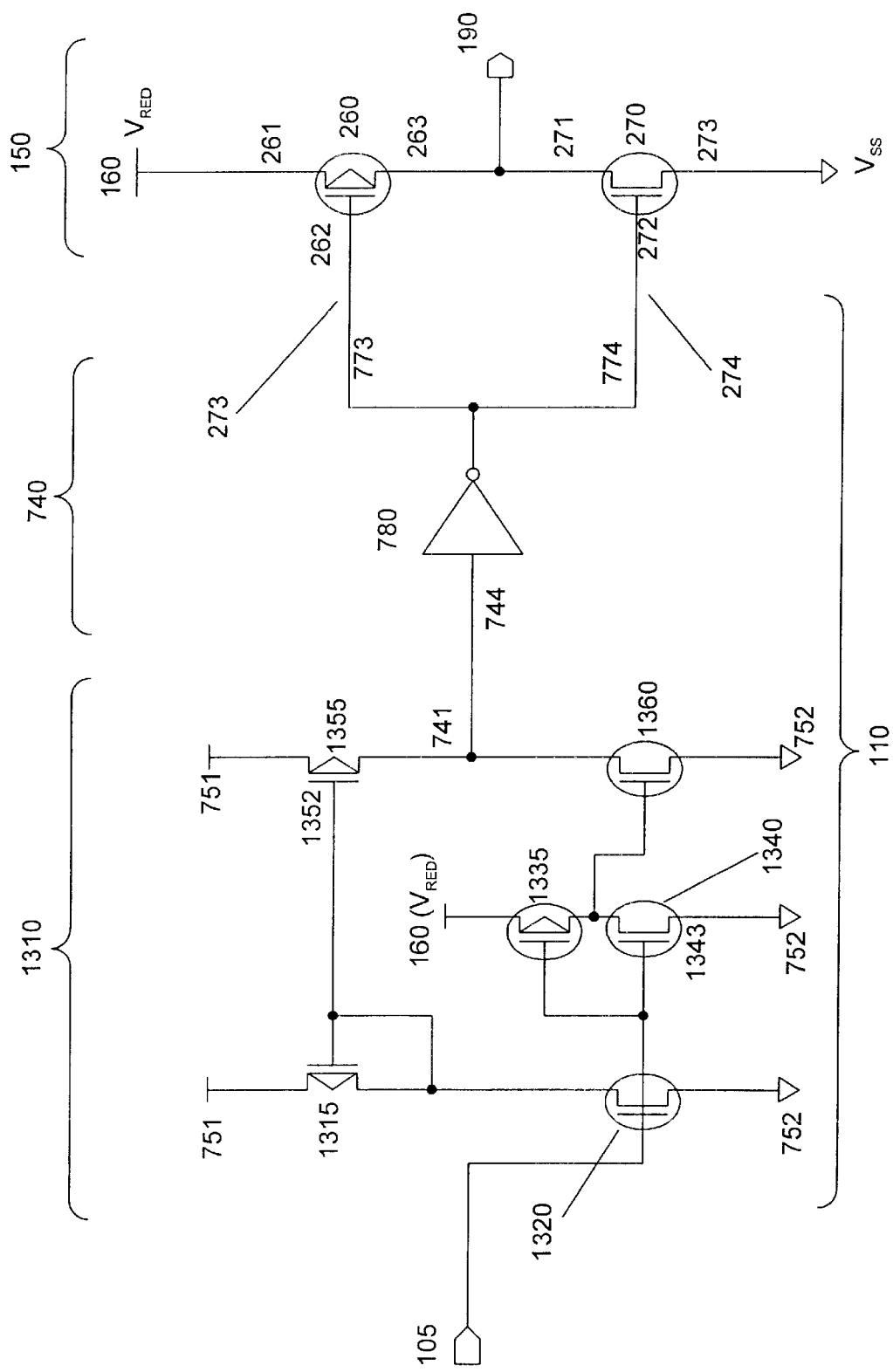

FIGS. 13 and 14 show alternative embodiments of the invention wherein the output stage 150 comprises a p-FET pull-up transistor 260 and an n-FET pull-down transistor 270 in series between $V_{RED}$ and $V_{SS}$. Referring to FIG. 13, the second substage is configured to produce control signals to form a non-inverting buffer circuit operating with reduced input and reduced output voltage signals. In one embodiment, the second substage comprises first and second control output nodes 273 and 274 coupled to the input node 744 by control signal paths 773 and 774, resulting in the first substage output signal serving as first and second control signals to operate the output stage.

Figure 15:
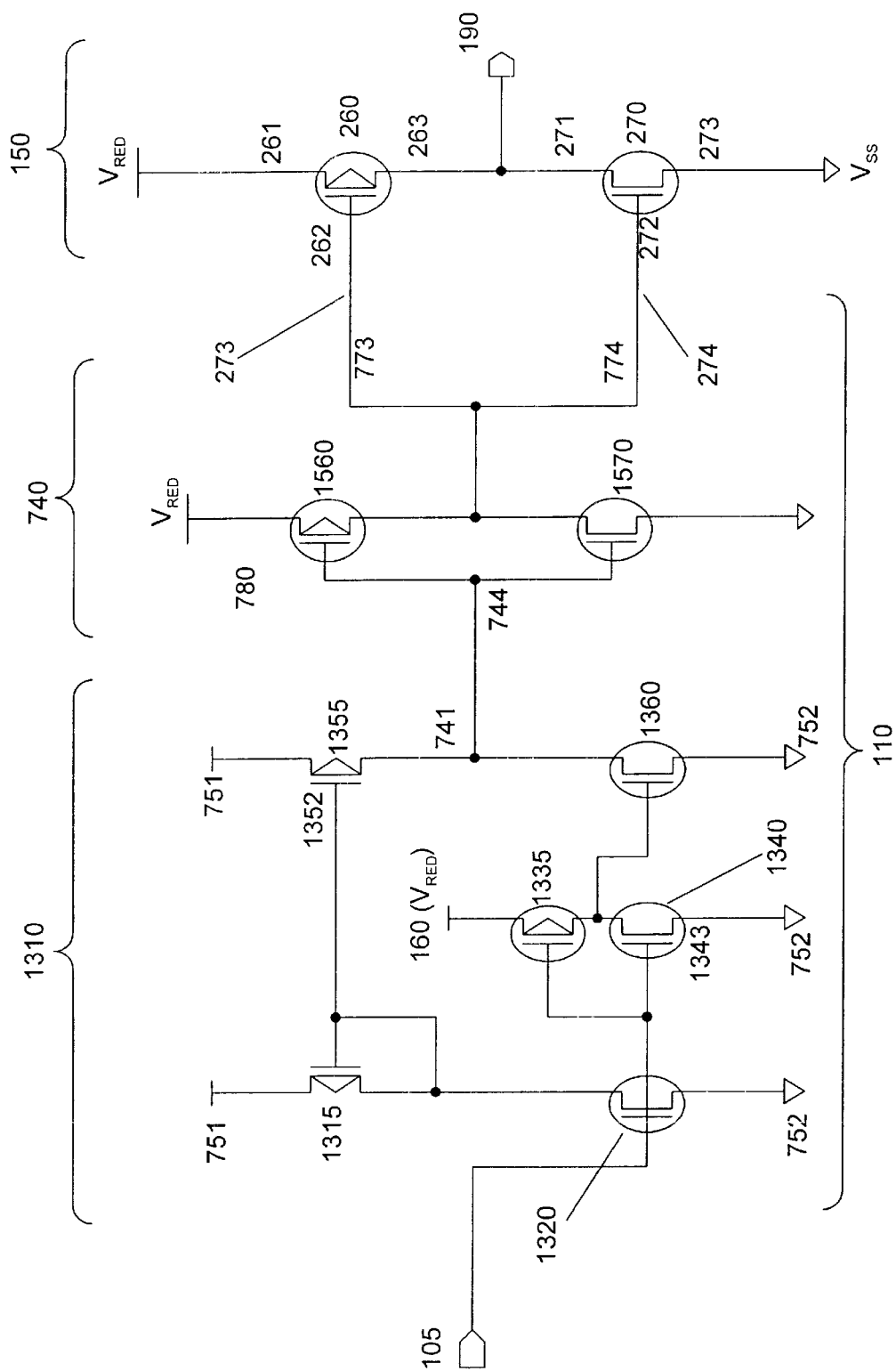

Referring to FIG. 14, the second substage 740 is configured to form an inverting buffer circuit having reduced input and reduced output voltage signals. As shown, an inverter 780 is provided. In one embodiment, an input terminal of the inverter is coupled to the second substage input node 744 and an output terminal is coupled to the first and second control signal paths 773 and 774, inverting the first substage output signal to serve and first and second control signals to operate the output stage. In a preferred embodiment shown in FIG. 15, the inverter 780 of the second substage 740 comprises first and second transistors 1560 and 1570 coupled in series between the reduced voltage upper rail ($V_{RED}$) and $V_{SS}$ In one embodiment, the first transistor is a p-FET and the second transistor is an n-FET. Preferably, the transistors of the inverter are reduced threshold voltage transistors.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claim is:

1. An integrated circuit comprising:
   a high power source having a high voltage level ($V_{DD}$), the high power source serves to operate a majority of logic circuits of the integrated circuit;
   a reduced high power source having a reduced high voltage level ($V_{RED}$) less than $V_{DD}$;
   a low power source at a low voltage level ($V_{SS}$);
   a buffer circuit having an input node for receiving an input signal and an output node, the buffer circuit, in response to an input signal having a reduced voltage range from about $V_{SS}$ to $V_{RED}$, generates an output signal having the reduced voltage range, the buffer circuit comprising an input stage and an output stage;
   the input stage coupled to the input node to receive the input signal, and generates control signals at control output nodes, the input stage comprising a first substage and a second substage, a first substage input node is coupled to the input node to receive the input signal and generates a first substage output signal having a voltage range greater than the reduced voltage range at a first substage output node and with a second substage input node coupled to the first substage output node to receive the first substage output signal, the second substage generates the control signals; and
   the output stage coupled to the input stage to receive the control signals and generates the output signal at the output node.

2. The integrated circuit of claim 1 wherein the voltage range of the first substage output signal is from about $V_{SS}$ to $V_{DD}$.

3. The integrated circuit of claim 2 wherein the first substage inverts the input signal.

4. The integrated circuit of claim 2 wherein the voltage range of the first substage output signal is from about $V_{SS}$ to greater than $V_{DD}$.

5. The integrated circuit of claim 4 wherein the first substage inverts the input signal.

6. The integrated circuit of claim 1 wherein the first substage comprises a level shifting means to generate the first substage output signal with a voltage range greater than the input signal with the reduced voltage range.

7. The integrated circuit of claim 6 wherein the voltage range of the first substage output signal is from $V_{SS}$ to $V_{DD}$.

8. The integrated circuit of claim 7 wherein the first substage inverts the input signal.

9. The integrated circuit of claim 6 wherein the voltage range of the first substage output signal is from $V_{SS}$ to greater than $V_{DD}$.

10. The integrated circuit of claim 9 wherein the first substage inverts the input signal.

11. The integrated circuit of claim 1, 2, 3, 4, 5, 6, 7, 8, 9, or 10 wherein the second substage comprises control signal paths for the control signals, the control signal paths are coupled to the second substage input node and to the control output nodes.

12. The integrated circuit of claim 1, 2, 3, 4, 5, 6, 7, 8, 9, or 10 wherein the second substage comprises means for generating first and second control signals, the first control signal controls a pull-up transistor of the output stage and the second control signal controls a pull-down transistor of the output stage.

13. The integrated circuit of claim 1, 2, 3, 4, 5, 6, 7, 8, 9, or 10 wherein the output stage comprises pull-up and pull-down transistors coupled in series between $V_{RED}$ and $V_{SS}$.

14. The integrated circuit of claim 1 herein the first substage comprises a level shifter, the level shifter receives the input signal and generated the first substage output signal.

15. The integrated circuit of claim 14 wherein the voltage range of the first substage output signal is from about $V_{SS}$ to $V_{DD}$.

16. The integrated circuit of claim 15 wherein the first substage inverts the input signal.

17. The integrated circuit of claim 14 wherein the voltage range of the first substage output signal is from about $V_{SS}$ to greater than $V_{DD}$.

18. The integrated circuit of claim 17 wherein the first substage inverts the input signal.

* * * * *